(12) United States Patent
Kim et al.

(10) Patent No.: US 6,677,100 B2
(45) Date of Patent: Jan. 13, 2004

(54) PHOTOSENSITIVE POLYMER CONTAINING SI, GE OR SN AND RESIST COMPOSITION COMPRISING THE SAME

(75) Inventors: Hyun-woo Kim, Suwon (KR); Sang-gyun Woo, Suwon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 66 days.

(21) Appl. No.: 09/950,799

(22) Filed: Sep. 13, 2001

(65) Prior Publication Data

US 2002/0072009 A1 Jun. 13, 2002

(30) Foreign Application Priority Data

Dec. 13, 2000 (KR) .............................................. 00-75944

(51) Int. Cl.$^7$ ........................... G03C 1/73; G03F 7/039; C08F 30/04; C08F 30/08; C08F 30/10; C08F 22/06

(52) U.S. Cl. .................. 430/270.1; 430/325; 430/326; 430/905; 430/910; 430/914; 430/921; 430/925; 526/240; 526/241; 526/271; 526/279; 526/270; 526/328

(58) Field of Search ................ 430/270.1, 905, 430/910, 914, 921, 925, 325, 326; 526/271, 279, 240, 241, 328, 270

(56) References Cited

U.S. PATENT DOCUMENTS 5,843,624 A * 12/1998 Houlihan et al. ............ 430/296
6,461,419 B1 * 10/2002 Wu et al. .................... 106/31.6
6,472,120 B1 * 10/2002 Jung et al. ................. 430/270.1
6,492,089 B2 * 12/2002 Hatakeyama et al. ..... 430/270.1

FOREIGN PATENT DOCUMENTS

JP 2001-159822 * 6/2001

OTHER PUBLICATIONS

Machine–Assisted English Translation of JP 2001–159822 Provided by Japan Patent Office, Jun. 12, 2001.*
Kessel et al, *Novel Silicon–Containing Resists for EUV and 193 nm Lithography*. Proceedings of SPIE, vol. 3678 (Part 1) p. 214–220, Mar. 15–17, 1999.*

* cited by examiner

Primary Examiner—Janet Baxter
Assistant Examiner—Sin J. Lee
(74) Attorney, Agent, or Firm—Lee & Sterba, P.C.

(57) ABSTRACT

A photosensitive polymer including a copolymer of an acrylate or methacrylate monomer having a group indicated by the following formula (I), a comonomer selected from a maleic anhydride monomer and a cyclic vinyl ether monomer, and a resist composition including the same.

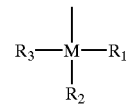

(I)

In the formula, $R_1$, $R_2$, $R_3$, and $R_4$ are independently a hydrogen atom, a $C_1$–$C_4$ alkyl group, a $C_1$–$C_4$ alkoxy group, a phenyl group, a benzyl group, a phenoxy group, or —$M(R')_3$, M is Si, Ge, Sn, or OSi, and each R' independently is a $C_1$–$C_4$ alkyl group, a $C_1$–$C_4$ alkoxy group, a phenyl group, or a phenoxy group.

26 Claims, No Drawings

PHOTOSENSITIVE POLYMER CONTAINING SI, GE OR SN AND RESIST COMPOSITION COMPRISING THE SAME

BACKGROUND OF THE INVENTION

1. Field of the Invention

The present invention relates to a chemically amplified resist composition, and more particularly, to a photosensitive polymer containing silicon and a resist composition comprising the same.

2. Description of the Related Art

As processes for manufacturing semiconductor devices become more complicated and the integration density of semiconductor devices increases, the need to form finer patterns becomes more pronounced. Furthermore, to manufacture semiconductor memory devices having a capacity of 1 Gigabit or more, a pattern size having a design rule of 0.2 μm or less is needed. Accordingly, there is a limitation in forming such a fine pattern using conventional photoresist materials using a KrF excimer laser (248 nm). For this reason, a lithography technique using a new exposure light source, the ArF excimer laser (193 nm), has emerged.

However, a resist material suitable for use in lithography with the ArF excimer laser causes many problems for practical use, compared with conventional resist materials. The most serious problem is the collapse of patterns with respect to an increase in the aspect ratio. Therefore, patterns must be formed using resist layers having a thickness of 4000 angstroms or less. Other problems associated with the ArF resist include the transmittance of the polymer. The ArF resist has inferior transmittance as compared to the KrF resist. This is another reason why the thickness of the ArF resist layer must be reduced.

Almost all well-known ArF resists have a resistance to dry etching that is equal or inferior to that of the KrF resist. Therefore, when an underlying layer is patterned by lithography using resist patterns obtained from the conventional resist materials, a satisfactory profile cannot be obtained.

Recently, to solve the foregoing problems, a technique using a bi-layer resist (BLR) has been suggested. In a process using BLR, the lithography is performed using a resist material containing silicon. Silicon atoms within the resist material are glassed in the form of $SiO_X$ during dry etching by $O_2$ plasma to form a cured layer, and the cured layer is used as an etching mask during a subsequent dry etching process. Therefore, when the aspect ratio is large, resistance to dry etching is increased by the curing layer, so that it is easy to form patterns, and collapse of patterns can also be prevented. As a result, patterns having a large aspect ratio can be formed with high resolving power.

The amount of silicon in a polymer is an important factor for a BLR. Generally, as the amount of silicon increases, the likelihood that there will be problems due to a reduction in the thermal stability of the resist layer and the wettability to a developer increases. Therefore, the polymer must contain the right amount of silicon for a BLR process, and development of a resist material having excellent thermal stability and wettability to a developer becomes a serious requirement.

SUMMARY OF THE INVENTION

It is a feature of the present invention to provide a photosensitive polymer that has a sufficient silicon content, that has a reduced manufacturing cost, and that provides excellent lithography characteristics when used as a resist material.

It is another feature of the present invention to provide a resist composition having a silicon content sufficient to be used as a BLR for ArF excimer laser lithography, and at the same time, has excellent thermal stability and wettability to a developer.

In accordance with one aspect of the present invention, there is provided a photosensitive polymer comprising a copolymer including acrylate or methacrylate monomer unit having a group indicated as the following formula (I), and a maleic anhydride monomer unit,

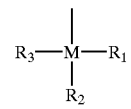

(I)

wherein $R_1$, $R_2$, and $R_3$ are independently a hydrogen atom, a $C_1$–$C_4$ alkyl group, a $C_1$–$C_4$ alkoxy group, a phenyl group, a benzyl group, a phenoxy group, or —$M(R')_3$, wherein M is Si, Ge, Sn, or OSi, and each R' independently is a $C_1$–$C_4$ alkyl group, a $C_1$–$C_4$ alkoxy group, a phenyl group, or a phenoxy group.

In a more particular embodiment, the photosensitive polymer comprises a copolymer having the following structural formula (II):

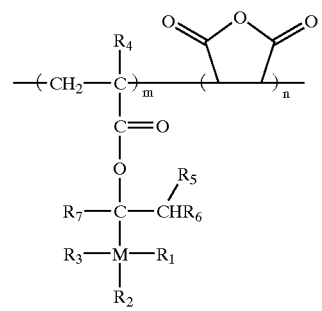

(II)

wherein $R_4$ is a hydrogen atom or a $C_1$–$C_4$ alkyl group, $R_5$, $R_6$, and $R_7$ are independently a hydrogen atom, a $C_1$–$C_4$ alkyl group, a $C_1$–$C_4$ alkoxy group, a phenyl group, a benzyl group, a phenoxy group, or —$M(R')_3$, wherein M is Si, Ge, Sn or OSi, and each R' independently is a $C_1$–$C_4$ alkyl group, a $C_1$–$C_4$ alkoxy group, a phenyl group, or a phenoxy group, and m/(m+n) is between about 0.2–0.9.

In another more particular embodiment, the photosensitive polymer comprises a copolymer having the following structural formula (III):

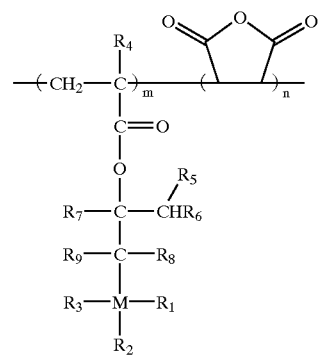

(III)

wherein $R_4$ is a hydrogen atom or a $C_1$–$C_4$ alkyl group, $R_5$, $R_6$, $R_7$, $R_8$, and $R_9$ are independently a hydrogen atom, a $C_1$–$C_4$ alkyl group, a $C_1$–$C_4$ alkoxy group, a phenyl group, a benzyl group, a phenoxy group, or —$M(R')_3$, wherein M is Si, Ge, Sn or OSi, and each R' independently is a $C_1$–$C_4$ alkyl group, a $C_1$–$C_4$ alkoxy group, a phenyl group, or a phenoxy group, and m/(m+n) is between about 0.2–0.9.

In a further more particular embodiment, the photosensitive polymer comprises a copolymer having the following structural formula (IV):

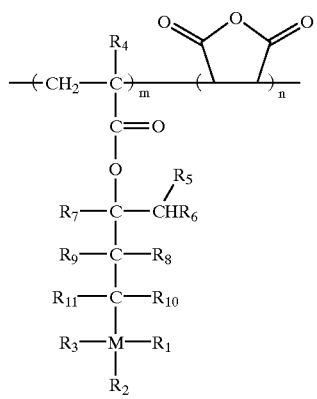
(IV)

wherein $R_4$ is a hydrogen atom or a $C_1$–$C_4$ alkyl group, $R_5$, $R_6$, $R_7$, $R_8$, $R_9$, $R_{10}$, and $R_{11}$ are independently a hydrogen atom, a $C_1$–$C_4$ alkyl group, a $C_1$–$C_4$ alkoxy group, a phenyl group, a benzyl group, a phenoxy group, or —$M(R')_3$, wherein M is Si, Ge, Sn or OSi, and each R' independently is a $C_1$–$C_4$ alkyl group, a $C_1$–$C_4$ alkoxy group, a phenyl group, or a phenoxy group, and $m/(m+n)$ is between about 0.2–0.9.

In accordance with another aspect of the present invention, there is provided a photosensitive polymer comprising a terpolymer including an acrylate or methacrylate monomer unit having a group indicated as the following formula (I), a maleic anhydride monomer unit, and a cyclic vinyl ether monomer unit,

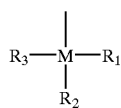
(I)

wherein $R_1$, $R_2$, and $R_3$ are independently a hydrogen atom, a $C_1$–$C_4$ alkyl group, a $C_1$–$C_4$ alkoxy group, a phenyl group, a benzyl group, a phenoxy group, or —$M(R')_3$, wherein M is Si, Ge, Sn, or OSi, and each R' independently is a $C_1$–$C_4$ alkyl group, a $C_1$–$C_4$ alkoxy group, a phenyl group, or a phenoxy group.

In a more particular embodiment, the photosensitive polymer comprises a terpolymer having the following structural formula (V):

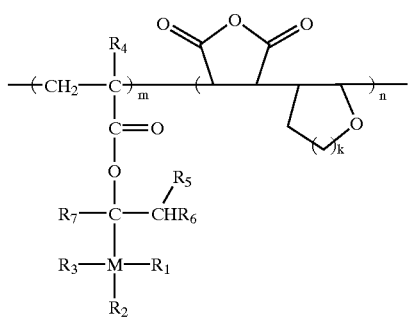
(V)

wherein, $R_4$ is a hydrogen atom or a $C_1$–$C_4$ alkyl group, $R_5$, $R_6$, and $R_7$ are independently a hydrogen atom, a $C_1$–$C_4$ alkyl group, a $C_1$–$C_4$ alkoxy group, a phenyl group, a benzyl group, a phenoxy group, or —$M(R')_3$, wherein M is Si, Ge, Sn, or OSi, and each R' independently is a $C_1$–$C_4$ alkyl group, a $C_1$–$C_4$ alkoxy group, a phenyl group, or a phenoxy group, k is an integer from 1 to 6, and $m/(m+n)$ is between about 0.2–0.9.

In another more particular embodiment, the photosensitive polymer comprises a terpolymer having the following structural formula (VI):

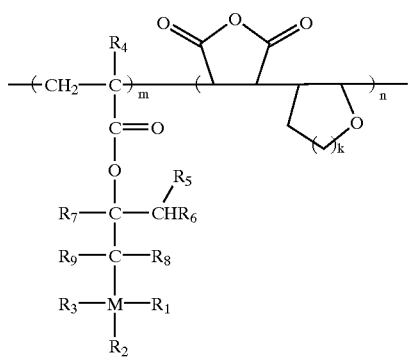
(VI)

wherein $R_4$ is a hydrogen atom or a $C_1$–$C_4$ alkyl group, $R_5$, $R_6$, $R_7$, $R_8$, and $R_9$ are independently a hydrogen atom, a $C_1$–$C_4$ alkyl group, a $C_1$–$C_4$ alkoxy group, a phenyl group, a benzyl group, a phenoxy group, or —$M(R')_3$, wherein M is Si, Ge, Sn, or OSi, and each R' independently is a $C_1$–$C_4$ alkyl group, a $C_1$–$C_4$ alkoxy group, a phenyl group, or a phenoxy group, k is an integer from 1 to 6, and $m/(m+n)$ is between about 0.2–0.9.

In a further more particular embodiment, the photosensitive polymer comprises a terpolymer having the following structural formula (VII):

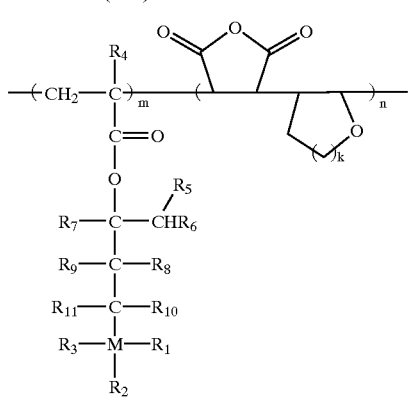
(VII)

wherein $R_4$ is a hydrogen atom or a $C_1$–$C_4$ alkyl group, $R_5$, $R_6$, $R_7$, $R_8$, $R_9$, $R_{10}$, and $R_{11}$ are independently a hydrogen atom, a $C_1$–$C_4$ alkyl group, a $C_1$–$C_4$ alkoxy group, a phenyl group, a benzyl group, a phenoxy group, or —$M(R')_3$, wherein M is Si, Ge, Sn or OSi, and each R' independently is a $C_1$–$C_4$ alkyl group, a $C_1$–$C_4$ alkoxy group, a phenyl group, or a phenoxy group, k is an integer from 1 to 6, and $m/(m+n)$ is between about 0.2–0.9.

In accordance with an additional aspect of the present invention, there is provided a resist composition comprising (a) a photosensitive polymer and (b) a photoacid generator (PAG). The photosensitive polymer comprises a copolymer of (a-1) an acrylate or methacrylate monomer having a group indicated by the formula (I) and (a-2) a comonomer selected from the group consisting of a maleic anhydride monomer and a cyclic vinyl ether monomer,

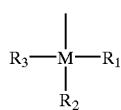

(I)

wherein $R_1$, $R_2$, and $R_3$ are independently a hydrogen atom, a $C_1$–$C_4$ alkyl group, a $C_1$–$C_4$ alkoxy group, a phenyl group, a benzyl group, a phenoxy group, or —M(R')$_3$, wherein M is Si, Ge, Sn, or OSi, and each R' independently is a $C_1$–$C_4$ alkyl group, a $C_1$–$C_4$ alkoxy group, a phenyl group, or a phenoxy group.

Particular embodiments of the photosensitive polymer comprised in a resist composition according to the present invention include photosensitive polymers of formulas (II)–(VII) as described above.

DETAILED DESCRIPTION OF THE INVENTION

Korean Patent Application No. 00-75944, filed on Dec. 13, 2000, and entitled: "Photosensitive Polymer Containing Silicon and Resist Composition Comprising the Same," is incorporated by reference herein in its entirety.

In particular embodiments of the resist composition according to the present invention, the weight average molecular weight of the photosensitive polymer is from about 3,000 to about 100,000.

Also, specific embodiments of the resist composition according to the present invention include the photoacid generator (PAG) in an amount from about 1 to about 30 wt % based on the weight of the photosensitive polymer. Preferably, the PAG is selected from the group consisting of triarylsulfonium salts, diaryliodonium salts, sulfonates, and mixtures thereof. More preferably, the PAG is triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene dicarboximide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene dicarboximide nonaflate, triphenylsulfonium perfluorobutanesulfonate, triphenylsulfonium perfluorooctanesulfonate (PFOS), triphenylsulfonium perfluorocamphorsulfonate, diphenyliodonium PFOS, methoxydiphenyliodonium PFOS, di-t-butyldiphenyliodonium triflate, N-hydroxysuccinimide PFOS, norbornene dicarboximide PFOS, or a mixture thereof.

The resist composition according to the present invention may further include an organic base. The organic base preferably is contained in an amount of about 0.01 to about 2.0 wt % based on the weight of the photosensitive polymer. Preferably, the organic base is a compound composed of a tertiary amine compound or a mixture of at least two tertiary amine compounds. More preferably, the organic base is triethylamine, triisobutylamine, triisooctylamine, triisodecylamine, diethanolamine, triethanolamine, or a mixture thereof.

More particular embodiments of the resist composition according to the present invention can further include a surfactant in an amount from about 30 to about 200 ppm.

Also, particular embodiments of the resist composition according to the present invention can further include a dissolution inhibitor in an amount from about 0.1 to about 50 wt % based on the weight of the photosensitive polymer.

The photosensitive polymer according to the present invention contains an element such as Si, Ge or Sn in its protecting group, and a maleic anhydride monomer or a cyclic vinyl ether monomer occupying a relatively small part within the polymer as an adhesion promoter. Therefore, the photosensitive polymer according to the present invention can be manufactured at low cost, and the resist composition can provide sufficient resistance to dry etching, and secure excellent thermal stability and wettability to a developing solution.

The present invention is further illustrated by the following non-limiting examples.

EXAMPLE 1

Synthesis of Copolymer

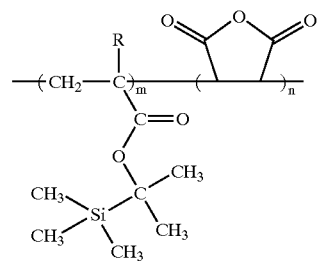

EXAMPLE 1-1

R=A Hydrogen Atom 18.6 g 2-trimethylsilyl-2-propyl acrylate (0.1 mol) and 9.8 g maleic anhydride (0.1 mol) are dissolved in an amount of tetrahydrofuran (THF), benzene, dioxane, or ethyl acetate from about 0.1 to about 3 times based on the weight of all of the monomers. Next, a polymerization initiator, in particular 2,2'-azobisisobutyronitrile (AIBN) or dimethyl 2,2'-azobisisobutyrate (V601), in an amount from about 0.1 to about 20 mol % on the basis of the total moles of all monomers, is added to the solution. Dissolved oxygen is extracted from the solution so obtained by degassing, and purging is performed using nitrogen. The resultant solution is polymerized at a temperature between about 50–90° C. for 2–48 hours, diluted with THF, and precipitated with excess isopropanol, ether, hexane, or a mixture thereof. The precipitate is dissolved in THF again, and precipitated twice with isopropanol, ether, hexane, or a mixture thereof. The precipitate so obtained is filtered, and dried in a vacuum oven at about 50° C. for about 24 hours.

The ratio of m and n in the copolymer having the above structure can be controlled by controlling the amounts of the two monomers used as synthesis sources, that is the amounts of (2-trimethylsilyl-2-propyl)acrylate and maleic anhydride.

As a result of synthesizing the copolymer having the above structure by the described method, 80% yield was obtained.

EXAMPLE 1-2

R=CH$_3$ 20 g 2-trimethylsilyl-2-propyl methacrylate (0.1 mol) and 9.8 g maleic anhydride (0.1 mol) are dissolved in an amount of THF, benzene, dioxane, or ethyl acetate from about 0.1 to about 3 times based on the weight of all of the monomers. Next, a polymerization initiator, in particular AIBN or V601, in an amount from about 0.1 to about 20 mol % on the basis of the total moles of all monomers, is added to the solution. Dissolved oxygen is extracted from the obtained solution by degassing, and purging is performed using nitrogen. The solution so obtained is polymerized at a temperature between about 50–90° C. for 2–48 hours, diluted with THF, and precipitated with excess isopropanol, ether, hexane, or a mixture thereof. The precipitate is dissolved in THF again, and precipitated twice with isopropanol, ether, hexane, or a compound thereof. The obtained precipitate is filtered, and dried in a vacuum oven at about 50° C. for about 24 hours.

As a result of synthesizing the copolymer having the above structure by the described method, 85% yield was obtained.

EXAMPLE 2

Synthesis of Copolymer

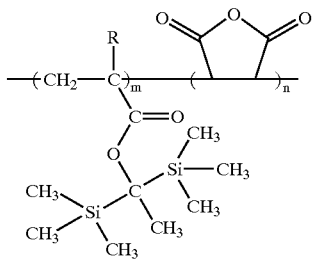

EXAMPLE 2-1

R=A Hydrogen Atom 24.4 g 1,1-bis(trimethylsilyl)ethyl acrylate (0.1 mol) and 9.8 g maleic anhydride (0.1 mol) are dissolved in an amount of THF, benzene, dioxane, or ethyl acetate from about 0.1 to about 3 times based on the weight of all of the monomers. Next, a polymerization initiator, in particular AIBN or V601 in an amount from about 0.1 to about 20 mol % on the basis of the total moles of all monomers, is added to the solution. Dissolved oxygen is extracted from the solution so obtained by degassing, and purging is performed using nitrogen. The solution thus obtained is polymerized at a temperature between about 50–90° C. for 2–48 hours, diluted with THF, and precipitated with excess isopropanol, ether, hexane, or a mixture thereof. The precipitate is dissolved in THF again, and precipitated twice with isopropanol, ether, hexane, or a mixture thereof. The precipitate thus obtained is filtered, and dried in a vacuum oven at about 50° C. for about 24 hours.

The ratio of m and n in the copolymer of the above structure can be controlled by controlling the amounts of two monomers used as synthesis sources, that is 1,1-bis (trimethylsilyl)ethyl acrylate and maleic anhydride.

As a result of synthesizing the copolymer having the above structure by the described method, 80% yield was obtained.

EXAMPLE 2-2

R=CH$_3$ 25.8 g 1,1-bis(trimethylsilyl)ethyl methacrylate (0.1 mol) and 9.8 g maleic anhydride (0.1 mol) are dissolved in an amount of THF, benzene, dioxane, or ethyl acetate from about 0.1 to about 3 times based on the weight of all of the monomers. Next, a polymerization initiator, in particular AIBN or V601, in an amount from about 0.1 to about 20 mol % on the basis of the total moles of all monomers, is added to the solution. Dissolved oxygen is extracted from the solution so obtained by degassing, and purging is performed using nitrogen. The solution thus obtained is polymerized at a temperature between about 50–90° C. for 2–48 hours, diluted with THF, and precipitated with excess isopropanol, ether, hexane, or a mixture thereof. The precipitate is dissolved in THF again, and precipitated twice with isopropanol, ether, hexane, or a mixture thereof. The precipitate so obtained is filtered, and dried in a vacuum oven at about 50° C. for about 24 hours.

As a result of synthesizing the copolymer having the above structure by the described method, 80% yield was obtained.

EXAMPLE 3

Synthesis of Copolymer

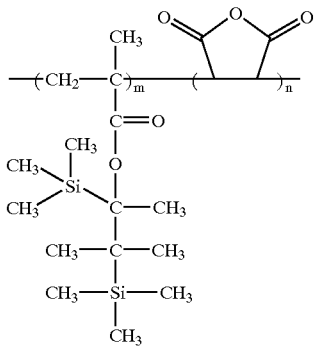

30 g monomer (0.1 mol) expressed by the following formula and 19.6 g maleic anhydride (0.2 mol) are dissolved in an amount of THF, benzene, dioxane, or ethyl acetate from about 0.1 to about 3 times based on the weight of all the monomers.

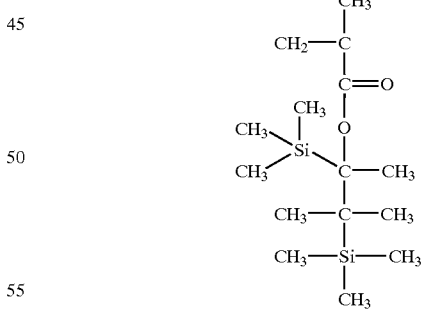

Next, a polymerization initiator, in particular AIBN or V601, in an amount from about 0.1 to about 20 mol % on the basis of the total moles of all monomers, is added to the solution. Dissolved oxygen is extracted from the solution so obtained by degassing, and purging is performed using nitrogen. The solution thus obtained is polymerized at a temperature between about 50–90° C. for 2–48 hours, diluted with THF, and precipitated with excess isopropanol, ether, hexane, or a mixture thereof. The precipitate is dissolved in THF again, and precipitated twice with isopropanol, ether, hexane, or a mixture thereof. The precipitate so obtained is filtered, and dried in a vacuum oven at about 50° C. for about 24 hours.

The ratio of m and n in the copolymer of the above structure can be controlled by controlling the amounts of two monomers used as synthesis sources.

As a result of synthesizing the copolymer having the above structure by the described method, 70% yield was obtained.

EXAMPLE 4

Synthesis of Copolymer

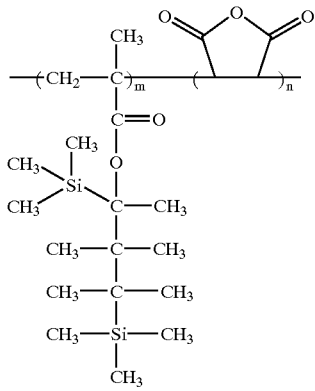

The copolymer having the above structure is synthesized by the same method as Example 3 using 34.3 g monomer (0.1 mol) expressed by the following formula and 19.6 g maleic anhydride (0.2 mol).

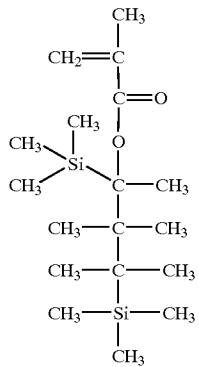

As a result of synthesizing the copolymer having the above structure by the described method, 65% yield was obtained.

EXAMPLE 5

Synthesis of Terpolymer

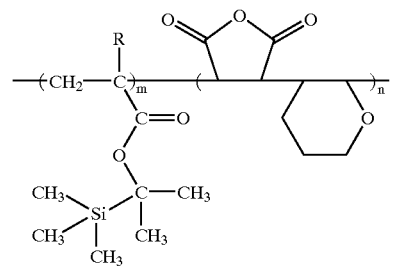

EXAMPLE 5-1

R=A Hydrogen Atom 18.6 g 2-trimethylsilyl-2-propyl acrylate (0.1 mol), 9.8 g maleic anhydride (0.1 mol), and 8.4 g 3,4-dihydro-2H-pyran (0.1 mol) are dissolved in an amount of THF, benzene, dioxane, or ethyl acetate from about 0.1 to about 3 times based on the weight of all the monomers. Next, a polymerization initiator, in particular AIBN or V601, in an amount from about 0.1 to about 20 mol % on the basis of the total moles of all monomers, is added to the solution. Dissolved oxygen is extracted from the solution so obtained by degassing, and purging is performed using nitrogen. The solution thus obtained is polymerized at a temperature between about 50–90° C. for 2–48 hours, diluted with THF, and precipitated with excess isopropanol, ether, hexane, or a mixture thereof. The precipitate is dissolved in THF again, and precipitated twice with isopropanol, ether, hexane, or a mixture thereof. The precipitate so obtained is filtered, and dried in a vacuum oven at about 50° C. for about 24 hours.

The ratio of m and n in the terpolymer of the above structure can be controlled by controlling the amounts of monomers used as synthesis sources.

As a result of synthesizing the terpolymer having the above structure by the described method, 80% yield was obtained.

EXAMPLE 5-2

R=CH₃

The terpolymer is synthesized by the same method as Example 5-1 using 20 g 2-trimethylsilyl-2-propyl methacrylate (0.1 mol) instead of 18.6 g 2-trimethylsilyl-2-propyl acrylate (0.1 mol).

EXAMPLE 6

Synthesis of Terpolymer

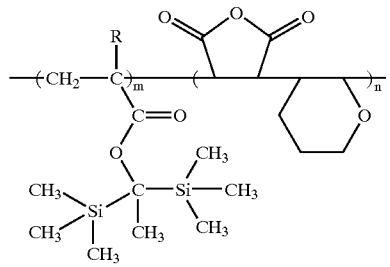

EXAMPLE 6-1

R=A Hydrogen Atom

The desired terpolymer is synthesized by the same method as Example 5-1 using 24.4 g 1,1-bis(trimethylsilyl) ethyl acrylate (0.1 mol), 9.8 g maleic anhydride (0.1 mol), and 8.4 g 3,4-dihydro-2H-pyran (0.1 mol).

As a result of synthesizing the terpolymer having the above structure by the described method, 80% yield was obtained.

EXAMPLE 6-2

R=CH$_3$

The desired terpolymer is synthesized by the same method as Example 5-1 using 25.8 g 1,1-bis(trimethylsilyl) ethyl methacrylate (0.1 mol), 9.8 g maleic anhydride (0.1 mol), and 8.4 g 3,4-dihydro-2H-pyran (0.1 mol).

EXAMPLE 7

Synthesis of Terpolymer

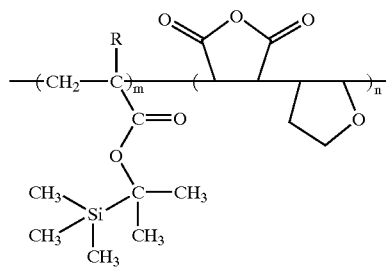

EXAMPLE 7-1

R=A Hydrogen Atom

The desired terpolymer is synthesized by the same method as Example 5-1 using 18.6 g 2-trimethylsilyl-2-propyl acrylate (0.1 mol), 9.8 g maleic anhydride (0.1 mol), and 7 g 2,3-dihydrofuran (0.1 mol).

As a result of synthesizing the terpolymer having the above structure by the described method, 80% yield was obtained.

EXAMPLE 7-2

R=CH$_3$

The desired terpolymer is synthesized by the same method as Example 5-1 using 20 g 2-trimethylsilyl-2-propyl methacrylate (0.1 mol), 9.8 g maleic anhydride (0.1 mol), and 7 g 2,3-dihydrofuran (0.1 mol).

EXAMPLE 8

Synthesis of Terpolymer

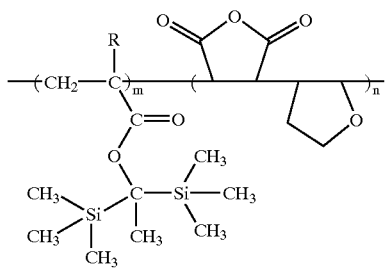

EXAMPLE 8-1

R=A Hydrogen Atom

The desired terpolymer is synthesized by the same method as Example 5-1 using 24.4 g 1,1-bis(trimethylsilyl) ethyl acrylate (0.1 mol), 9.8 g maleic anhydride (0.1 mol), and 7 g 2,3-dihydrofuran (0.1 mol).

EXAMPLE 8-2

R=CH$_3$

The desired terpolymer is synthesized by the same method as Example 5-1 using 25.8 g 1,1-bis(trimethylsilyl) ethyl methacrylate (0.1 mol), 9.8 g maleic anhydride(0.1 mol), and 7 g 2,3-dihydrofuran (0.1 mol).

EXAMPLE 9

Synthesis of Terpolymer

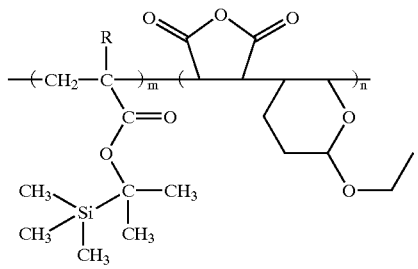

EXAMPLE 9-1

R=A Hydrogen Atom

The desired terpolymer is synthesized by the same method as Example 5-1 using 18.6 g 2-trimethylsilyl-2-propyl acrylate (0.1 mol), 9.8 g maleic anhydride (0.1 mol), and 12.8 g 3,4-dihydro-2-ethoxy-2H-pyran (0.1 mol).

EXAMPLE 9-2

R=CH$_3$

The desired terpolymer is synthesized by the same method as Example 5-1 using 20 g 2-trimethylsilyl-2propyl methacrylate (0.1 mol), 9.8 g maleic anhydride (0.1 mol), and 12.8 g 3,4-dihydro-2-ethoxy-2H-pyran (0.1 mol).

EXAMPLE 10

Synthesis of Terpolymer

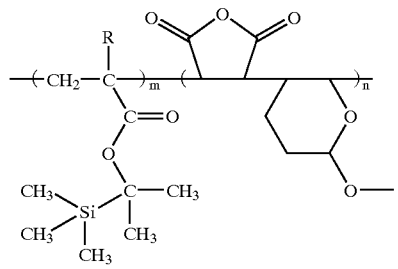

EXAMPLE 10-1

R=A Hydrogen Atom

The desired terpolymer is synthesized by the same method as Example 5-1 using 18.6 g 2-trimethylsilyl-2-propyl acrylate (0.1 mol), 9.8 g maleic anhydride (0.1 mol), and 11.4 g 3,4-dihydro-2-methoxy-2H-pyran (0.1 mol).

EXAMPLE 10-2

R=CH₃

The desired terpolymer is synthesized by the same method as Example 5-1 using 20 g 2-trimethylsilyl-2-propyl methacrylate (0.1 mol), 9.8 maleic anhydride (0.1 mol), and 11.4 g 3,4-dihydro-2-methoxy-2H-pyran (0.1 mol).

EXAMPLE 11

Synthesis of Terpolymer

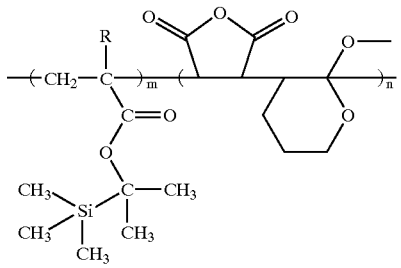

EXAMPLE 11-1

R=A Hydrogen Atom

The desired terpolymer is synthesized by the same method as Example 5-1 using 18.6 g 2-trimethylsilyl-2-propyl acrylate (0.1 mol), 9.8 g maleic anhydride (0.1 mol), and 11.4 g 5,6-dihydro-4-methoxy-2H-pyran (0.1 mol).

EXAMPLE 11-2

R=CH₃

The desired terpolymer is synthesized by the same method as Example 5-1 using 20 g 2-trimethylsilyl-2-propyl methacrylate (0.1 mol), 9.8 g maleic anhydride (0.1 mol), and 11.4 g 5,6-dihydro-4-methoxy-2H-pyran (0.1 mol).

EXAMPLE 12

Synthesis of Terpolymer

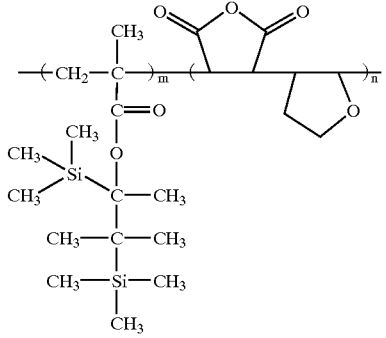

The desired terpolymer is synthesized by the same method as Example 5-1 using 30 g monomer of the structure illustrated in Example 3 (0.1 mol), 9.8 g maleic anhydride (0.1 mol), and 7 g 2,3-dihydrofuran (0.1 mol).

As a result of synthesizing the terpolymer having the above structure by the described method, 70% yield was obtained.

EXAMPLE 13

Synthesis of Terpolymer

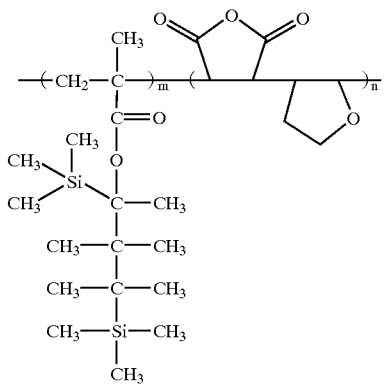

The desired terpolymer is synthesized by the same method as Example 5-1 using 34.3 g monomer of the structure illustrated in Example 4 (0.1 mol), 9.8 g maleic anhydride (0.1 mol), and 7 g 2,3-dihydrofuran (0.1 mol).

As a result of synthesizing the terpolymer having the structure by the described method, 66% yield was obtained.

EXAMPLE 14

Lithography Performance

The polymers (1.0 g) obtained in Examples 1 through 13 are dissolved in a propylene glycol monomethyl ether acetate (PGMEA) (8.0 g) solution with a photoacid generator (PAG), 0.01–0.03 g triphenylsulfonium trifluoromethansulfonate (triflate), and an organic base, 2 mg triisobutylamine, respectively, and filtered using a 0.2 μm membrane filter, so that respective resist compositions are obtained. The resist compositions are coated on Si wafers treated by organic anti-reflective coating (ARC) to a thickness of about 0.1–0.3 μm.

Next, the respective wafers coated with the resist compositions are soft-baked at a temperature between about 120–130° C. for about 90 seconds, exposed using an ArF or KrF excimer laser stepper, and post-exposure baked (PEB) at a temperature of about 120° C. for about 90 seconds. Next, the wafers are developed using a 2.38 wt % tetramethylammonium hydroxide (TMAH) solution for about 60 seconds to form resist patterns.

Patterns are transcribed in an underlying layer with $O_2$-RIE (reactive ion etch) using the obtained resist patterns.

In the above description, after the resist layers are developed using a developer, and the resist patterns are formed, patterns are transcribed in an underlying layer by $O_2$-RIE. However, it is possible to transcribe patterns in an underlying layer by omitting the step of developing with a developer and directly applying $O_2$-RIE to a latent image after performing PEB.

Also, in the above description, between about 0.01–0.03 g triphenylsulfonium triflate is used as the PAG, but any material conventionally used as a PAG can be used. For example, between about 0.01–0.06 g triphenylsulfonium perfluorobutanesulfonate, triphenylsulfonium perfluorooctanesulfonate, or triphenylsulfonium perfluorocamphorsulfonate can be used.

A photosensitive polymer according to the present invention contains an element such as Si, Ge, or Sn in its protecting group. When patterns are formed using a resist composition comprising such a photosensitive polymer, the protecting group is removed by acid generated by far-ultraviolet rays such as KrF or ArF, and by PEB. Therefore, the content of the element such as Si, Ge, or Sn becomes different in an exposure portion and a non-exposure portion, and at the same time, solubility to an alkali solvent becomes different. Then, the latent image is etched using $O_2$-RIE, or the latent image is developed with an alkali solution, and patterned, and the underlying layer then etched using $O_2$-RIE. Here, an oxide layer which is composed of $SiO_x$ is formed in the non-exposure portion where Si, Ge or Sn exists among the resist layers during dry etching, and such an oxide layer does not exist in the exposure portion. Therefore, the underlying layer formed of, for example, a reflection preventing layer, can be patterned using a difference in the selectivity to $O_2$-RIE in the non-exposure portion and the exposure portion.

Also, the photosensitive polymer according to the present invention includes an acrylate or methacrylate monomer unit containing Si, Ge, or Sn, and a maleic anhydride monomer unit or a cyclic vinyl ether monomer unit acting as an adhesion promoter. Here, since the size of the portion acting as an adhesion promoter within a polymer is relatively very small, the portion of Si, Ge, or Sn among the whole structure of the polymer becomes relatively larger. Therefore, superior selectivity can be provided as compared to conventional materials. Also, the maleic anhydride monomer and vinyl ether monomer are very cheap. Therefore, the photosensitive polymer according to the present invention can be manufactured at low cost, and the resist composition can provide sufficient resistance to dry etching, and secure excellent thermal stability and wettability to a developer.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A photosensitive polymer comprising a copolymer having the following structural formula (II)

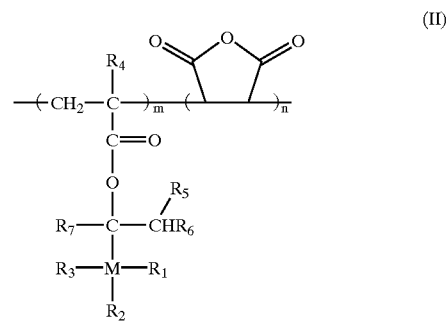

(II)

wherein $R_4$ is a hydrogen atom or a $C_1$–$C_4$ alkyl group, $R_1$, $R_2$, $R_3$, $R_5$, $R_6$, and $R_7$ are independently a hydrogen atom, a $C_1$–$C_4$ alkyl group, a $C_1$–$C_4$ alkoxy group, a phenyl group, a benzyl group, a phenoxy group, or —M(R')$_3$, M is Si, Ge, Sn or OSi, each R' independently is a $C_1$–$C_4$ alkyl group, a $C_1$–$C_4$ alkoxy group, a phenyl group, or a phenoxy group, and m/(m+n) is from about 0.2 to about 0.9.

2. A photosensitive polymer comprising a copolymer having the following structural formula (III)

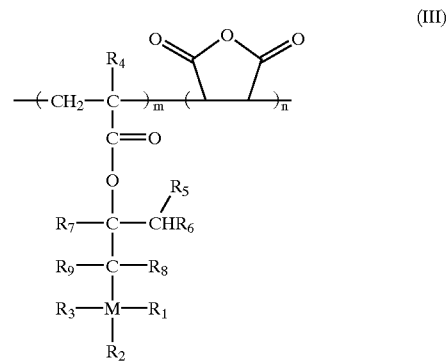

(III)

wherein $R_4$ is a hydrogen atom or a $C_1$–$C_4$ alkyl group, $R_1$, $R_2$, $R_3$, $R_5$, $R_6$, $R_7$, $R_8$, and $R_9$ are independently a hydrogen atom, a $C_1$–$C_4$ alkyl group, a $C_1$–$C_4$ alkoxy group, a phenyl group, a benzyl group, a phenoxy group, or —M(R')$_3$, M is Si, Ge, Sn or OSi, each R' independently is a $C_1$–$C_4$ alkyl group, a $C_1$–$C_4$ alkoxy group, a phenyl group, or a phenoxy group, and m/(m+n) is from about 0.2 to about 0.9.

3. A photosensitive polymer comprising a terpolymer including an acrylate or methacrylate monomer unit having a group indicated by the following formula (I), a maleic anhydride monomer unit, and a cyclic vinyl ether monomer unit,

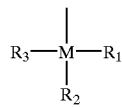

(I)

wherein $R_1$, $R_2$, and $R_3$ are independently a hydrogen atom, a $C_1$–$C_4$ alkyl group, a $C_1$–$C_4$ alkoxy group, a phenyl group, a benzyl group, a phenoxy group, or —M(R')$_3$, M is Si, Ge, Sn, or OSi, and each R' independently is a $C_1$–$C_4$ alkyl group, a $C_1$–$C_4$ alkoxy group, a phenyl group, or a phenoxy group.

4. The photosensitive polymer of claim 3 comprising a terpolymer having the following structural formula (V)

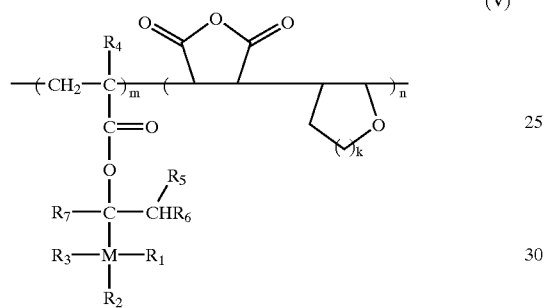

(V)

wherein $R_4$ is a hydrogen atom or a $C_1$–$C_4$ alkyl group, $R_5$, $R_6$, and $R_7$ are independently a hydrogen atom, a $C_1$–$C_4$ alkyl group, a $C_1$–$C_4$ alkoxy group, a phenyl group, a benzyl group, a phenoxy group, or —M(R')$_3$, M is Si, Ge, Sn, or OSi, each R' independently is a $C_1$–$C_4$ alkyl group, a $C_1$–$C_4$ alkoxy group, a phenyl group, or a phenoxy group, k is an integer from 1 to 6, and m/(m+n) is from about 0.2 to about 0.9.

5. The photosensitive polymer of claim 3 comprising a terpolymer having the following structural formula (VI)

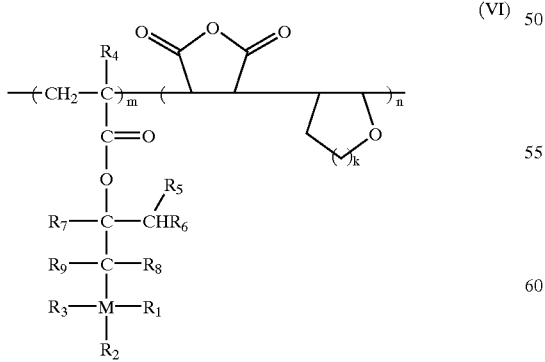

(VI)

wherein $R_4$ is a hydrogen atom or a $C_1$–$C_4$ alkyl group, $R_5$, $R_6$, $R_7$, $R_8$, and $R_9$ are independently a hydrogen atom, a $C_1$–$C_4$ alkyl group, a $C_1$–$C_4$ alkoxy group, a phenyl group, a benzyl group, a phenoxy group, or —M(R')$_3$, M is Si, Ge, Sn, or OSi, each R' independently is a $C_1$–$C_4$ alkyl group, a $C_1$–$C_4$ alkoxy group, a phenyl group, or a phenoxy group, k is an integer from 1 to 6, and m/(m+n) is from about 0.2 to about 0.9.

6. The photosensitive polymer of claim 3 comprising a terpolymer having the following structural formula (VII)

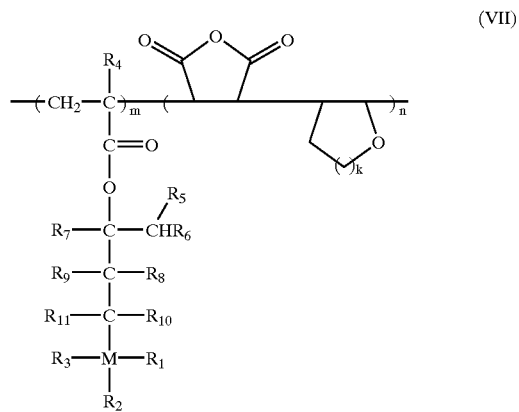

(VII)

wherein $R_4$ is a hydrogen atom or a $C_1$–$C_4$ alkyl group, $R_5$, $R_6$, $R_7$, $R_8$, $R_9$, $R_{10}$, and $R_{11}$ are independently a hydrogen atom, a $C_1$–$C_4$ alkyl group, a $C_1$–$C_4$ alkoxy group, a phenyl group, a benzyl group, a phenoxy group, or M(R')$_3$, M is Si, Ge, Sn or OSi, each R' independently is a $C_1$–$C_4$ alkyl group, a $C_1$–$C_4$ alkoxy group, a phenyl group, or a phenoxy group, k is an integer from 1 to 6, m/(m+n) is from about 0.2 to about 0.9.

7. A resist composition comprising:

photosensitive polymer having a structure selected from the following structures (II) and (III):

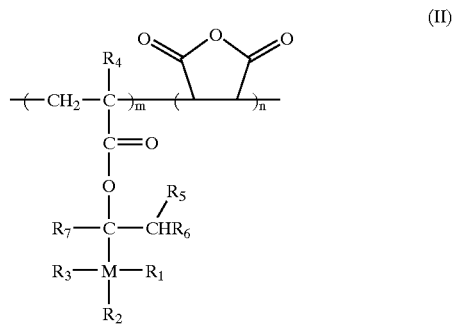

(II)

-continued

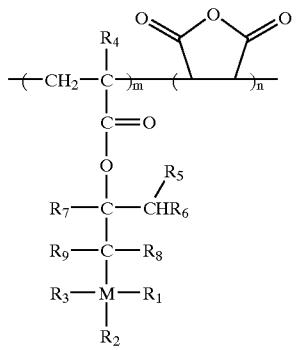

(III)

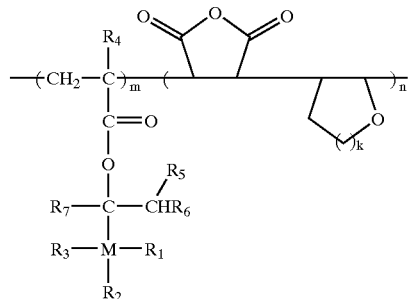

(V)

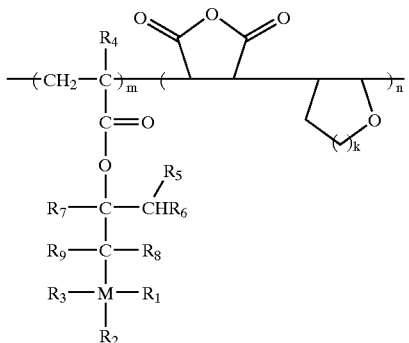

(VI)

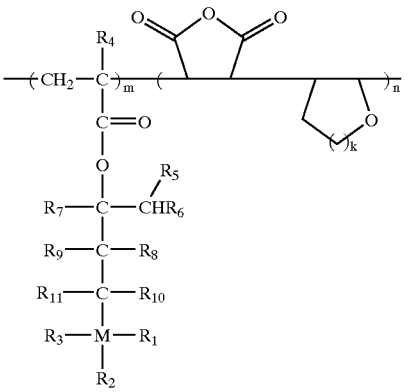

(VII)

wherein $R_4$ is a hydrogen atom or a $C_1$-$C_4$ alkyl group, $R_1$, $R_2$, $R_3$, $R_5$, $R_6$, $R_7$, $R_8$, and $R_9$, are independently a hydrogen atom, a $C_1$–$C_4$ alkyl group, a $C_1$–$C_4$ alkoxy group, a phenyl group, a benzyl groups, a phenoxy group, or —M(R')$_3$, M is Si, Ge, Sn, or OSi, each R' independently is a $C_1$–$C_4$ alkyl group, a $C_1$–$C_4$ alkoxy group, a phenyl group, or a phenoxy group, and m/(m+n) is between about 0.2 to about 0.9

(b) a photoacid generator (PAG).

8. The resist composition of claim 7, wherein the weight average molecular weight of the photosensitive polymer is between about 3,000 to about 100,000.

9. The resist composition of claim 7, wherein the PAG is contained in an amount from about 1 to about 30 wt % based on the weight of the photosensitive polymer.

10. The resist composition of claim 7, wherein the PAG is selected from the group consisting of triarylsulfonium salts, diaryliodonium salts, sulfonates, and mixtures thereof.

11. The resist composition of claim 7, further comprising an organic base.

12. The resist composition of claim 11, wherein the organic base is contained in an amount from about 0.01 to about 2.0 wt % based on the weight of the photosensitive polymer.

13. The resist composition of claim 11, wherein the organic base is a tertiary amine compound or a mixture of at least two tertiary amine compounds.

14. The resist composition of claim 13, wherein the organic base is triethylamine, triisobutylamine, triisooctylamine, triisodecylamine, diethanolamine, triethanolamine, or a mixture of thereof.

15. The resist composition of claim 7, further comprising a surfactant in an amount from about 30 to about 200 ppm.

16. The resist composition of claim 7, further comprising a dissolution inhibitor in an amount from about 0.1 to about 50 wt % based on the weight of the photosensitive polymer.

17. A resist composition comprising:

photosensitive polymer having a structure selected from the following structures (V) to (VII):

wherein $R_4$ is a hydrogen atom or a $C_1$–$C_4$ alkyl group, $R_1$, $R_2$, $R_3$, $R_5$, $R_6$, $R_7$, $R_8$, $R_9$, $R_{10}$, and $R_{11}$ are independently a hydrogen atom, a $C_1$–$C_4$ alkyl group, a $C_1$–$C_4$ alkoxy group, a phenyl group, a benzyl group, a phenoxy group, or —M(R')$_3$, M is Si, Ge, Sn or OSi, each R' independently is a $C_1$–$C_4$ alkyl group, a $C_1$–$C_4$ alkoxy group, a phenyl group, or a phenoxy group, k is an integer from 1 to 6, and m/(m+n) is between about 0.2 to about 0.9, and (b) a photoacid generator (PAG).

18. The resist composition of claim 17, wherein the weight average molecular weight of the photosensitive polymer is between about 3,000 to about 100,000.

19. The resist composition of claim 17, wherein the PAG is contained in an amount from about 1 to about 30 wt % based on the weight of the photosensitive polymer.

20. The resist composition of claim 17, wherein the PAG is selected from the group consisting of triarylsulfonium salts, diaryliodonium salts, sulfonates, and mixtures thereof.

21. The resist composition of claim 17, further comprising an organic base.

22. The resist composition of claim 21, wherein the organic base is contained in an amount from about 0.01 to about 2.0 wt % based on the weight of the photosensitive polymer.

23. The resist composition of claim 21, wherein the organic base is a tertiary amine compound or a mixture of at least two tertiary amine compounds.

24. The resist composition of claim 23, wherein the organic base is triethylamine, triisobutylamine, triisooctylamine, triisodecylamine, diethanolamine, triethanolamine, or a mixture of thereof.

25. The resist composition of claim 17, further comprising a surfactant in an amount from about 30 to about 200 ppm.

26. The resist composition of claim 17, further comprising a dissolution inhibitor in an amount from about 0.1 to about 50 wt % based on the weight of the photosensitive polymer.

* * * * *